United States Patent [19]

Vallone et al.

[11] Patent Number: 5,023,544
[45] Date of Patent: Jun. 11, 1991

[54] EXTENDED INPUT AND TESTING OF ELECTRICAL COMPONENTS FOR ONSERTION MACHINES

[75] Inventors: Giacinto Vallone, Endicott; Stanley W. Janisiewicz, Endwell; Michael D. Snyder, Binghamton; Gerald B. Hemmelgarn, Owego; Wayne A. Glidden, Johnson City, all of N.Y.

[73] Assignee: Universal Instruments Corporation, Binghamton, N.Y.

[21] Appl. No.: 616,765

[22] Filed: Nov. 20, 1990

Related U.S. Application Data

[63] Continuation of Ser. No. 33,843, Apr. 3, 1987, abandoned, which is a continuation of Ser. No. 705,114, Feb. 25, 1985, abandoned.

[51] Int. Cl.⁵ .................. G01R 31/02; B65C 47/24; B07C 5/344
[52] U.S. Cl. .................. 324/158 F; 198/394; 209/573; 324/73.1; 414/730
[58] Field of Search .............. 324/73.1, 158 F; 209/573, 574; 198/394; 414/730; 901/31, 40

[56] References Cited

U.S. PATENT DOCUMENTS

| | | | |
|---|---|---|---|
| 3,304,499 | 2/1967 | Vincze | 324/73 AT |
| 4,212,075 | 7/1980 | Cleversey et al. | 324/73 AT |
| 4,320,339 | 3/1982 | Vancelette | 324/73 AT |
| 4,593,820 | 6/1986 | Antonie et al. | 324/158 F |

FOREIGN PATENT DOCUMENTS

| | | |
|---|---|---|
| 55-125800 | of 1980 | Japan . |
| 56-124997 | 3/1981 | Japan . |
| 56-126389 | 9/1981 | Japan . |
| 57-48672 | of 1982 | Japan . |
| 57-148672 | 3/1982 | Japan . |
| 57-145394 | 9/1982 | Japan . |

OTHER PUBLICATIONS

Hoebener, K. G.; "Multiple Size Chip Pickup, Orientation and Placement Station"; IBM Tech. Dis. Bull. vol. 22; No. 7; Dec. 1979; pp. 2757–2761.

*Primary Examiner*—Ernest F. Karlsen
*Attorney, Agent, or Firm*—Fidelman & Wolffe

[57] ABSTRACT

The invention comprises an extended input system by which additional component supply stations are located out of reach of the pick and place heads of a machine for handling surface mountable components and are selectively addressable by a supply shuttle which fetches individual components and delivers each component selectively to a test pocket or a utility pocket of a transfer assembly, form which the components are retrievable by a pick and place head of the onserter. In a preferred embodiment, the transfer assembly provides a second shuttle on which the utility and test pockets are mounted for movement back and forth between the supply shuttle unload station to a pick-up station of the head, and the component testing occurs during transit of the transfer shuttle.

11 Claims, 9 Drawing Sheets

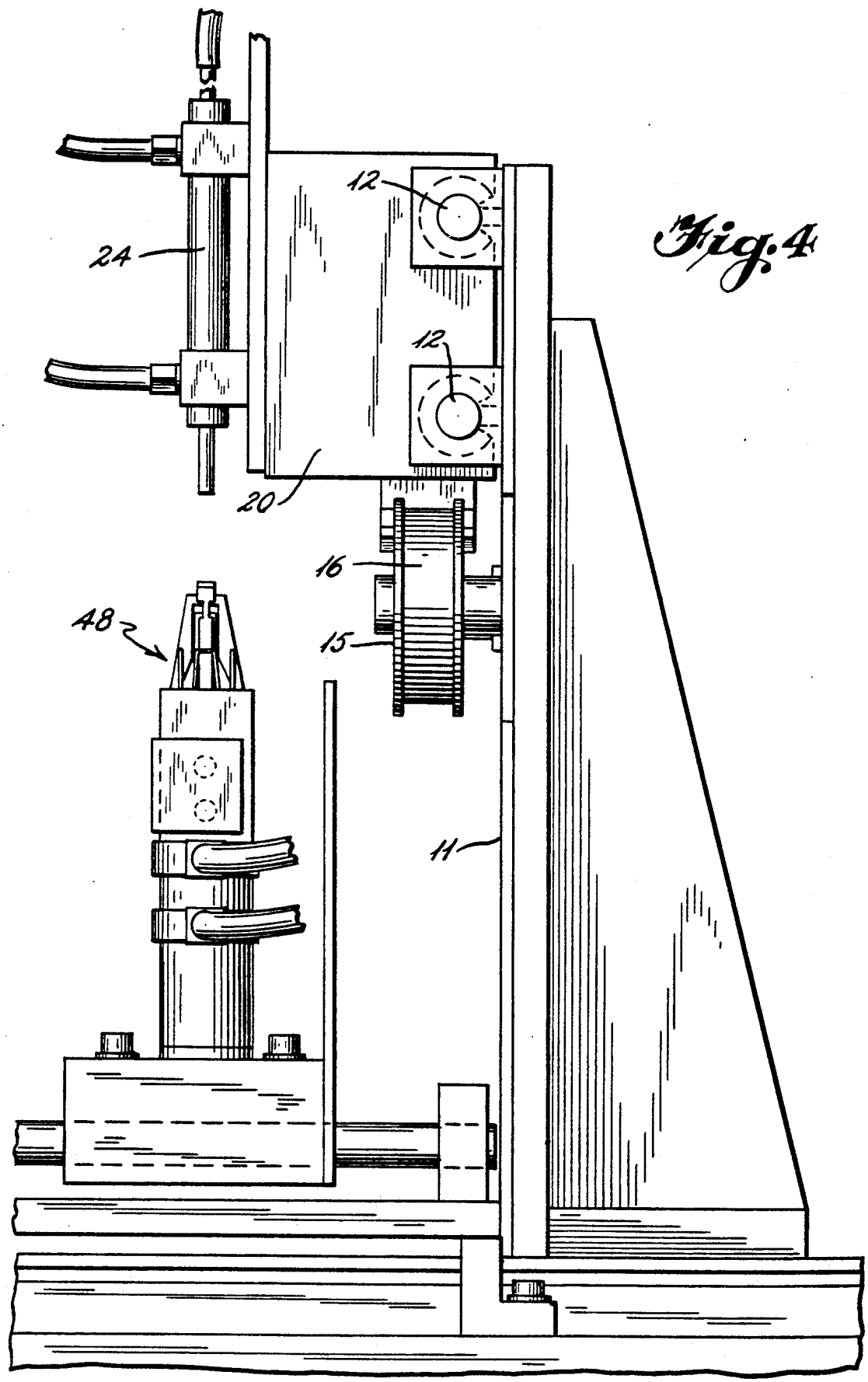

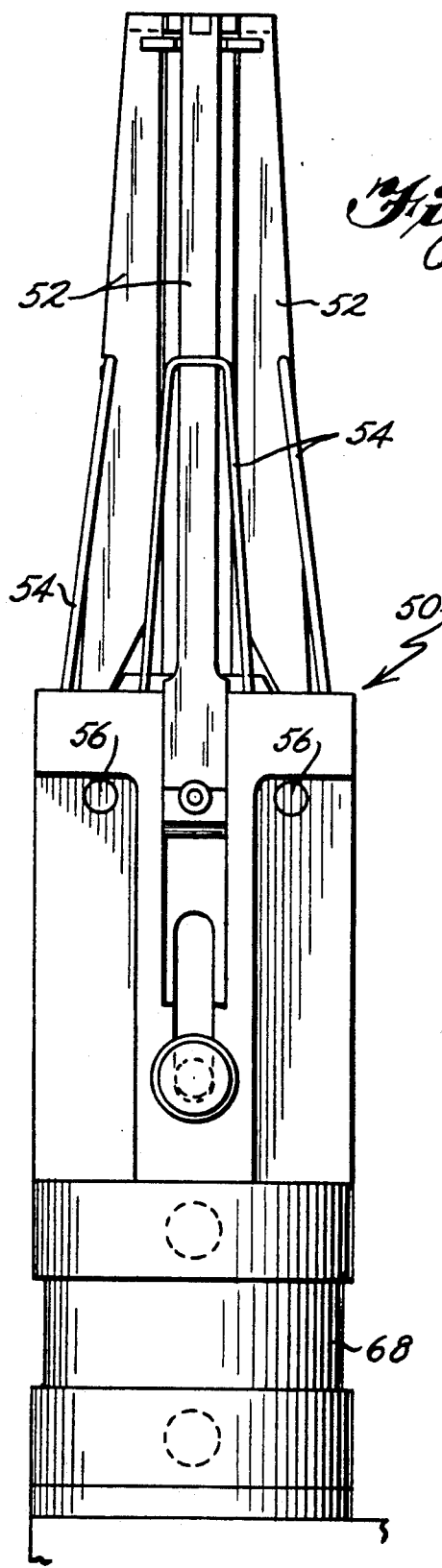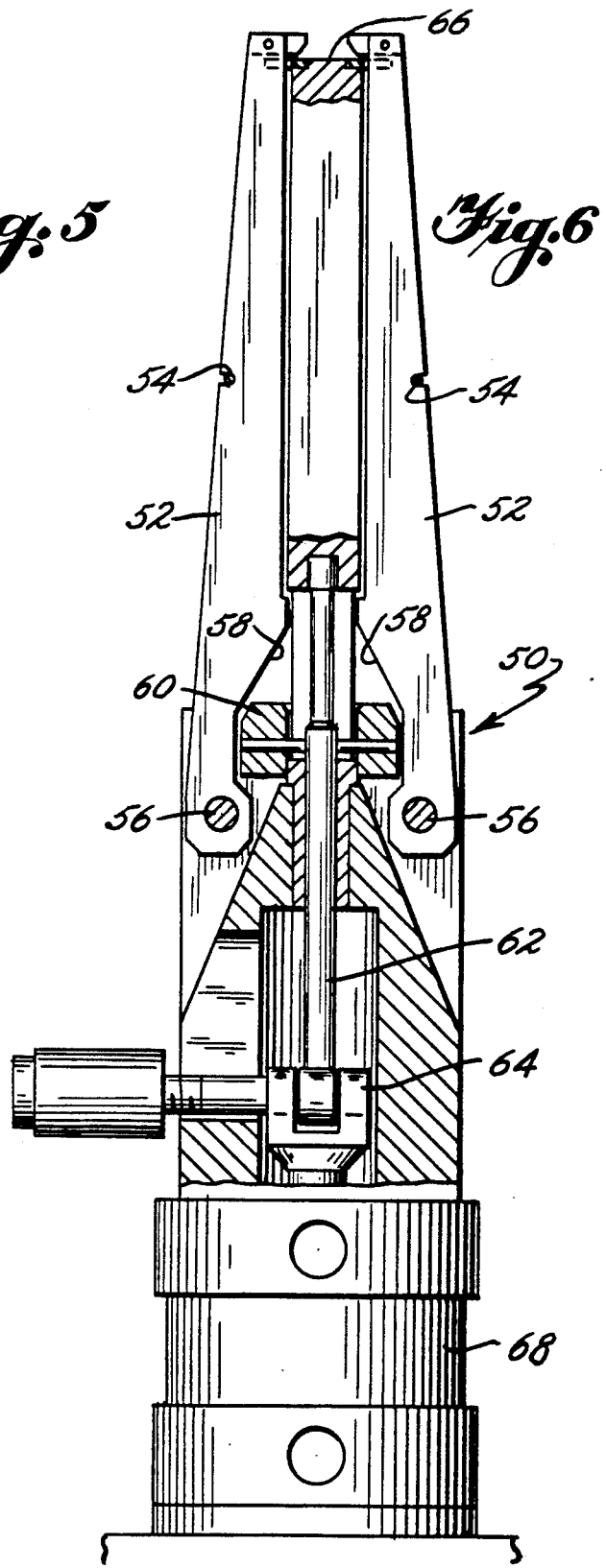

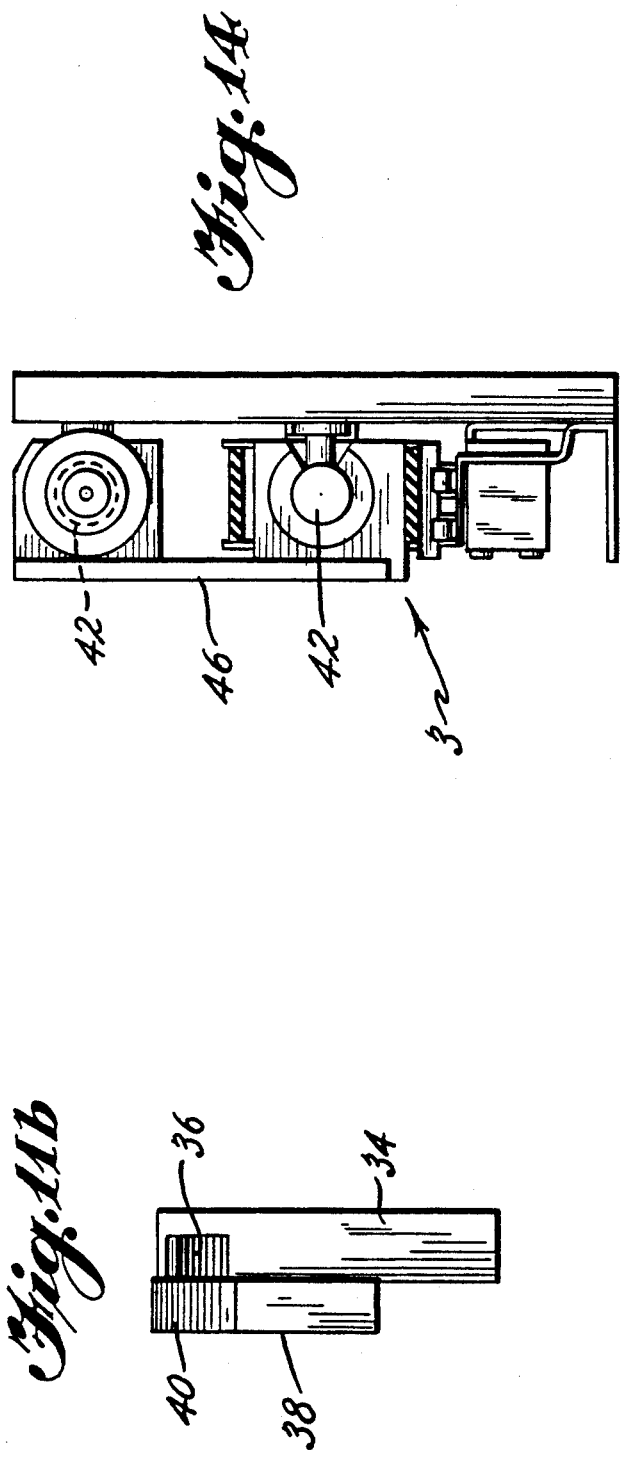

EXTENDED INPUT AND TESTING OF ELECTRICAL COMPONENTS FOR ONSERTION MACHINES

This application is a continuation of U.S. application Ser. No. 033,843, filed Apr. 3, 1987, now abandoned, which is a continuation of Ser. No. 06/705,114, filed Feb. 25, 1985, now abandoned.

PRIOR ART CROSS-REFERENCES

Japanese Utility Model Application No. 24187/1980, laid open Sept. 25, 1981—APPARATUS FOR TRANSFERRING ARTICLES—KONO, et al.

Japanese Utility Model Application No. 125800/1980, laid open Mar. 18, 1982—ELECTRIC PARTS MOUNTING DEVICE—Hineno Japanese Patent Application No. 30747/1981, laid open Sept. 8, 1982—ELECTRONIC PARTS MOUNTING APPARATUS—Mori, et al.

Japanese Patent Application No. 100998/1979, laid open Mar. 10, 1981—ELECTRIC PART MOUNTING DEVICE—Hineno IBM Technical Disclosure Bulletin, Vol 22, No. 7, December 1979, pp. 2757-2761.

U.S. Application, Ser. No. 693,987, filed Jan. 23, 1985, now U.S. Pat. No. 4,721,907, —APPARATUS FOR AUTOMATED TESTING OF SURFACE MOUNTED COMPONENTS—Dean, et al.

BACKGROUND AND SUMMARY OF THE INVENTION

The invention is directed to a method and apparatus for handling electrical components and particularly for fetching and squaring electrical components and selectively testing electrical functioning of at least some of the components, in preparation for mounting of the components to a printed circuit board (PCB) automatedly by an insertion or surface mounting process.

Insertion, as the name implies, generally involves inserting the leads of a component through the holes of the circuit board and clinching protruding portions of the inserted leads to the underside of the board so as to hold the component in preparation for subsequent soldering of the leads to electrical tracks of the board.

Surface mounting generally involves surface mounting of miniature components, without the need for lead receiving holes at the mounting locations of the circuit board, as by using a dot of glue to hold the component in preparation for subsequent soldering of electrical connectors of the component to the electrical tracks. The thickness of these surface mounted components generally range from 0.018-0.062 inches, with width and length dimensions perpendicular to the thickness generally ranging from 0.040-0.250 inches. The electrical connectors of surface mountable components may comprise: conductive pads which are generally flush with the component body; hemispherical conductive balls; and/or conductive leads protruding from the body. The tips of the protruding conductive leads may extend past or be generally flush with the component body "mounting surface" which is adjacent and generally parallel to the circuit board top surface when mounted.

Input to a pick-up station may be in the form of taped components from reels or ammo packs and/or bulk components from vibratory feeders and flexible sticks. All of these types of inputs are presently used in prior art surface mounting machines in which pick and place heads are suspended above circuit boards and translatable in the X and Y coordinates of a horizontal plane in order to retrieve selected components from the inputs and mount them at selected positions on the circuit boards. However, such machines are physically limited in their capacity for board population by the limited numbers of input stations which are addressable by each pick and place head. Thus, the need exists for some manner of increasing the population capacities of such machines in a reliable and economical fashion.

Accordingly, it is an object of this invention to provide a method and apparatus for increasing the population capacities of surface mounting machines and the like while testing electrical functioning of selected components.

The invention comprises an extended input system by which additional component supply stations are located out of reach of the pick and place heads of a surface mounting machine and are selectively addressable by a supply shuttle which fetches individual components and delivers each component selectively to a test pocket or a utility pocket of a transfer assembly, from which the components are retrievable by a pick and place head of the machine. In a preferred embodiment, the transfer assembly provides a second shuttle on which the utility and test pockets are mounted for movement back and forth between the supply shuttle unload station to a pick-up station of the head, and the component testing occurs during transit of the transfer shuttle.

BRIEF DESCRIPTION OF THE DRAWINGS

FIG. 4 is a partial right side elevation of the device of FIG. 3.

FIG. 5 is a front elevation of the utility transfer pocket.

FIG. 6 is a left side elevation, partially in cross-section, of FIG. 5.

FIG. 11a is an enlarged, top plan view of the stop of FIG. 10.

FIG. 11b is a right side elvation of FIG. 11a.

FIG. 14 is a right side elevation of FIG. 13.

DETAILED DESCRIPTION OF THE INVENTION

Figure 12:
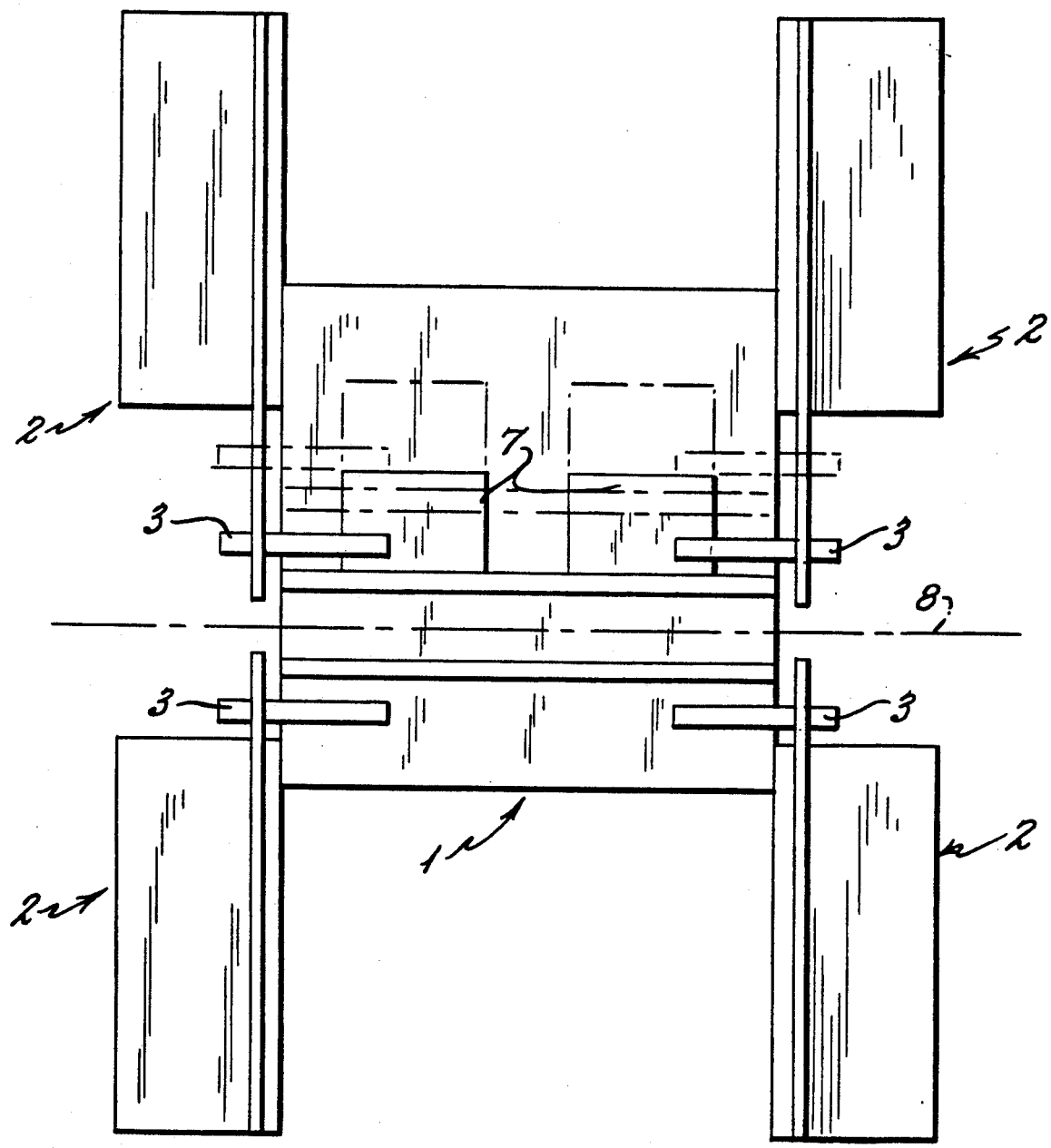
FIG. 12 is a schematic top plan view of a pick and place machine and the positional relation thereof to the supply and transfer shuttles of the instant invention.
Figure 13:
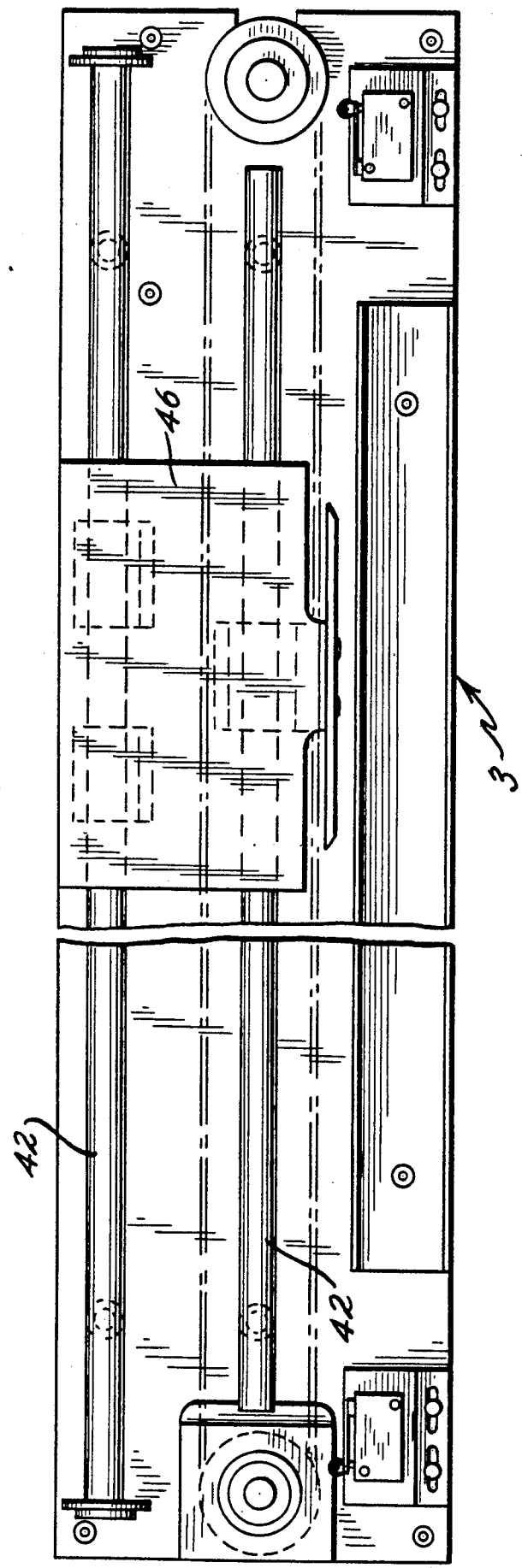
FIG. 13 is a top plan view of the transfer assembly, without the utility and test pockets mounted thereon.

Referring to FIG. 12, a pick and place surface mounting machine 1 may have a circuit board feedthrough axis 8 along which circuit boards are transported during population thereof with components. Each such surface mounting machine 1 usually has a limited number of input stations mounted on integral mounting plates 7 which are adjustable to the illustrated phantom line positions in accordance with different sizes of circuit boards to be passed along axis 8. FIG. 12 provides a top plan schematic view illustrating the positional relationship between such a surface mounting machine 1 and four extended input assemblies 2 and a corresponding number of transfer assemblies 3 of the instant invention. Typically, the onsertion machine 1 will have two pick and place heads.

Figure 1:
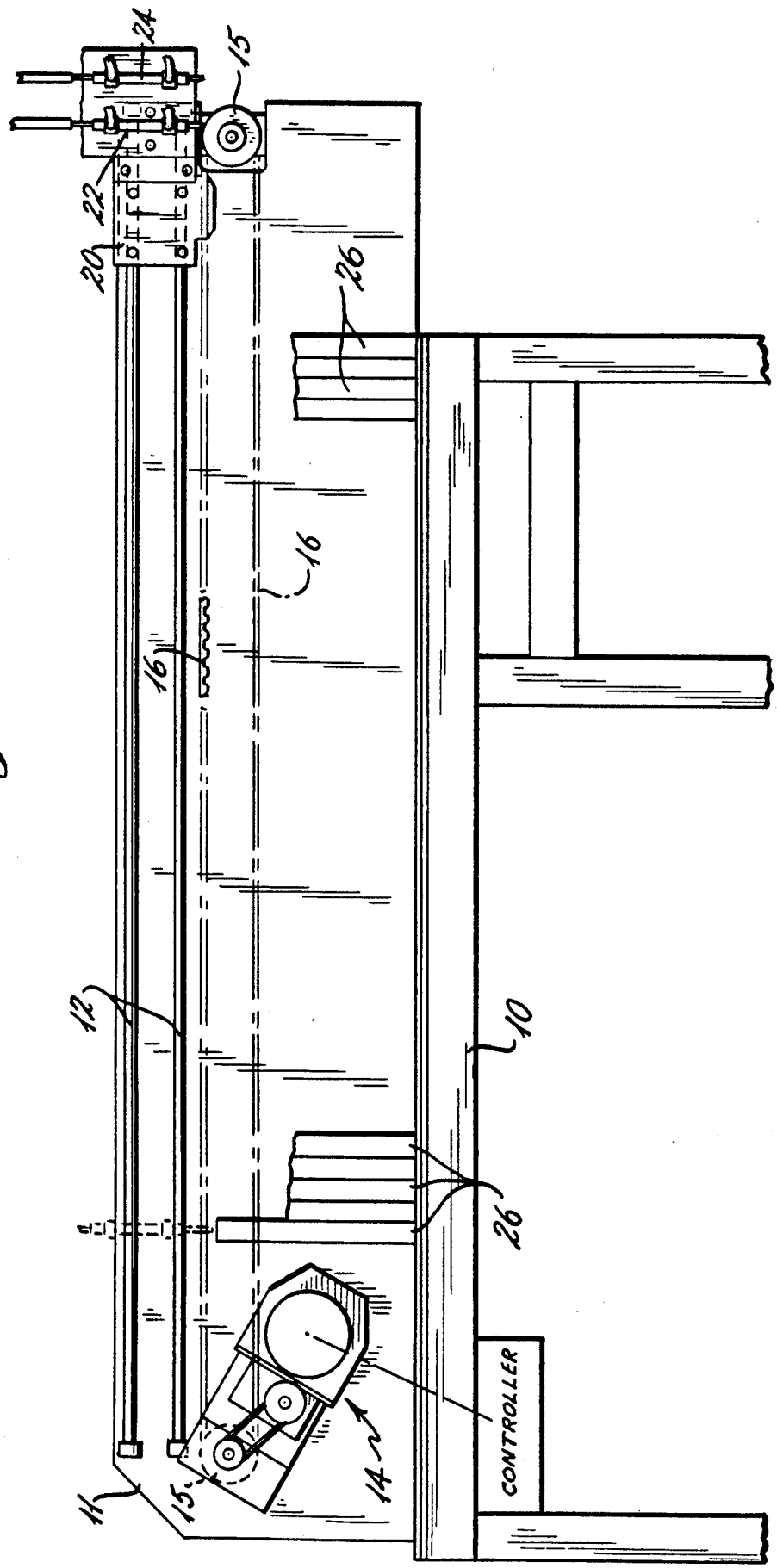
FIG. 1 is a front elevation of the extended input assembly of the instant invention, with the feeder stations illustrated fragmentarily.
Figure 2:
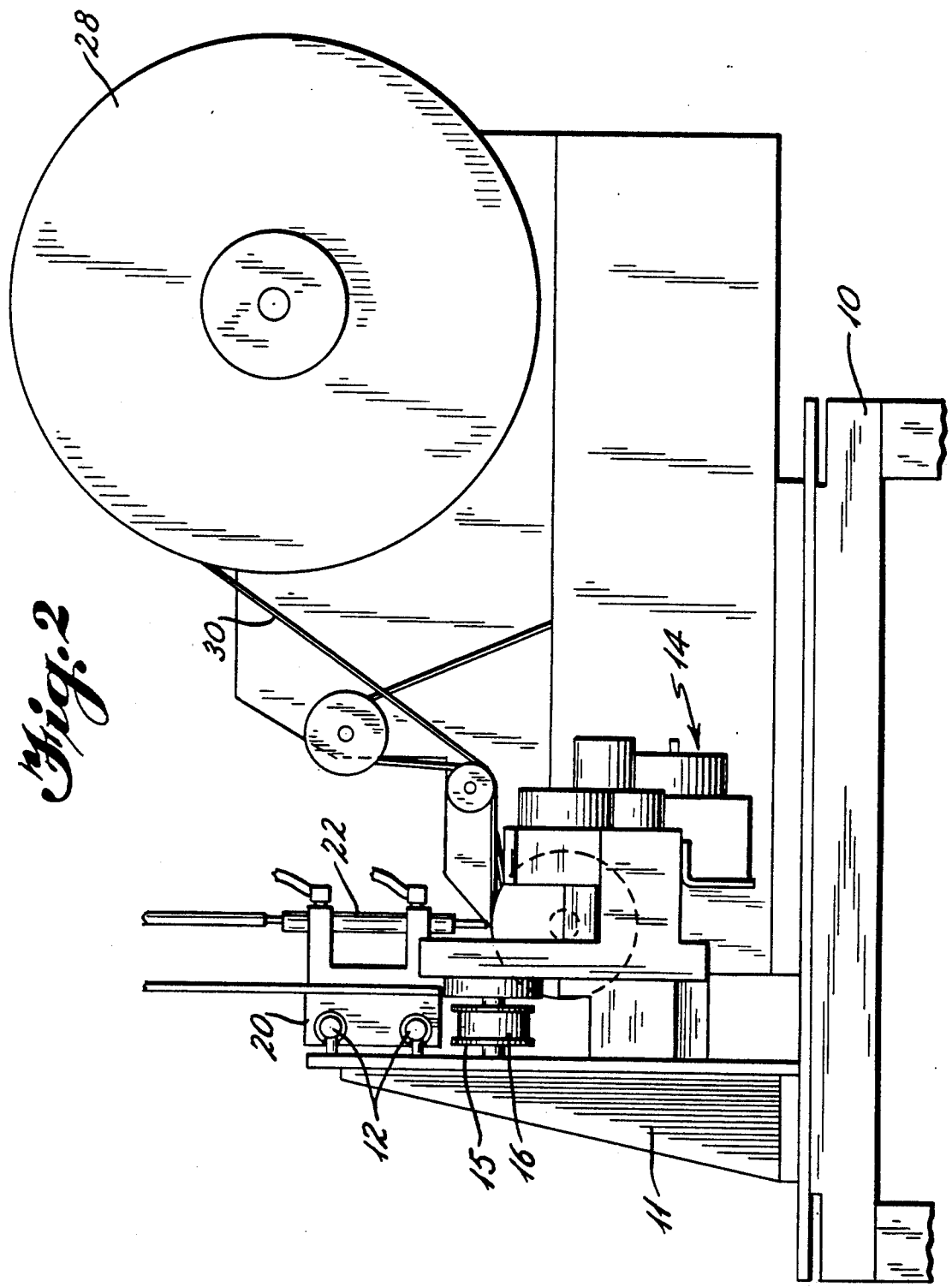
FIG. 2 is a left side elevation of the device of FIG. 1, but with a feeder reel fully illustrated.

Referring to FIGS. 1 and 2, an extended input assembly comprises a mounting frame 10 supporting a bracket 11 to which a pair of Thompson rods 12 are mounted. Rods 12 slidingly support a supply shuttle 20 upon which a pair of vacuum nozzle heads 22,24 are mounted. A pair of pulleys 15 support a timing belt 16 which is attached to shuttle 20 in order to drive it along rods 12 according to drive assembly 14. Drive assembly 14 may comprise a motor and encoder to ensure selective positioning of shuttle 20 along rods 12. A plurality of supply stations 26 are positioned along the length of frame 10 and may take the form of a tape feeder 28 (as shown in FIG. 2) as well as vibratory feeders. In accordance with the controller of FIG. 1, shuttle 20 is selectively positioned so that at least one of the vacuum nozzles 22,24 may retrieve a component 5 from a selected supply station 26 and then deliver the component 5 to a shuttle unload station.

Figure 3:
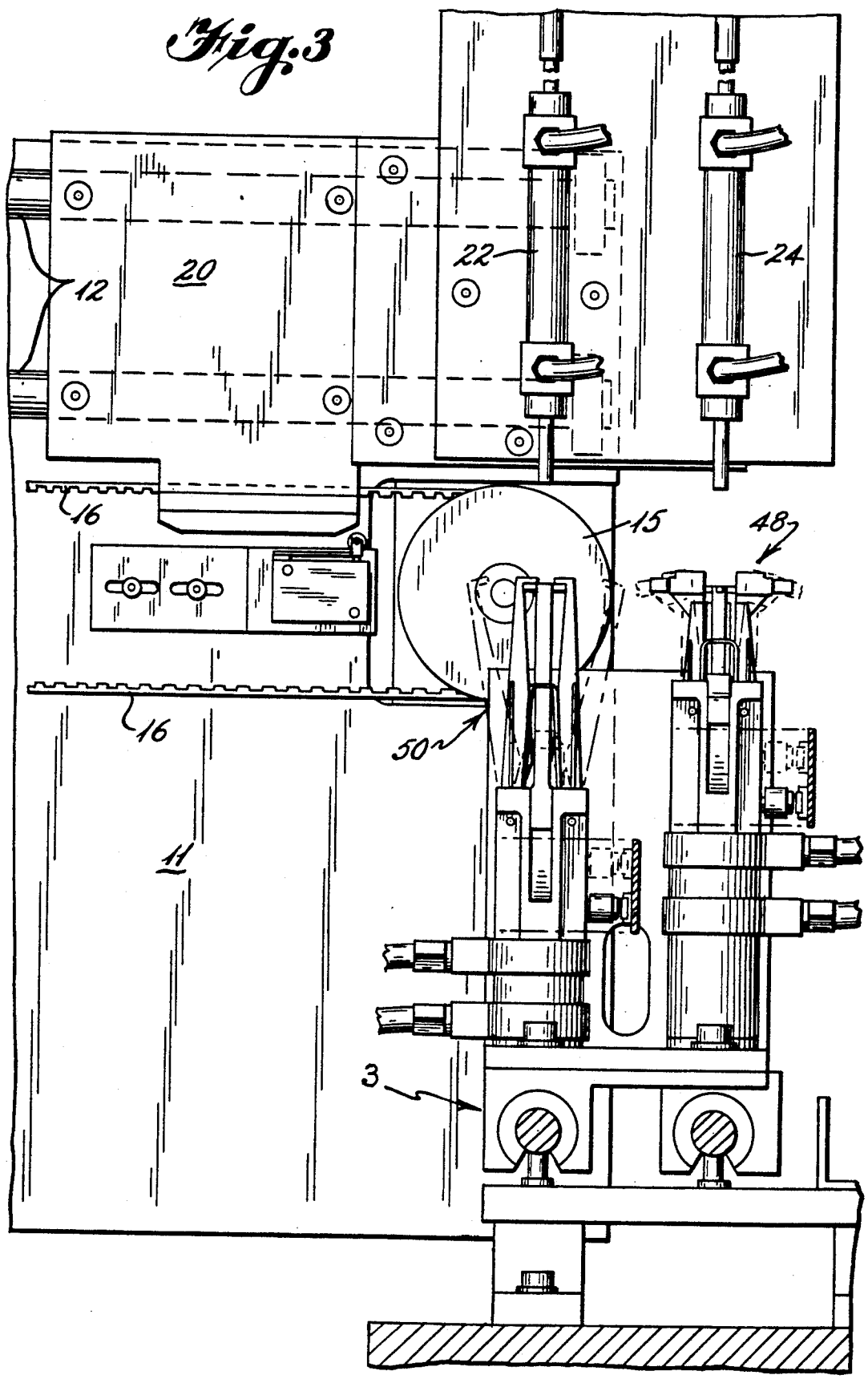
FIG. 3 is a fragmentary front elevation of the extended input and the relation of the supply shuttle to the transfer assembly with utility and test pockets.

Referring to FIGS. 3 and 4, shuttle 20 is located at the unload station of the extended input assembly 2 so that a component delivered thereto from a supply station 26 may be deposited in one of two pockets 48,50 of a transfer assembly 3. Transfer assembly 3 has Thompson rods 42 along which a transfer shuttle 46 is reciprocatable by a drive assembly (not shown) similar to drive assembly 14 of extended input assembly 2. Mounted on transfer shuttle 46 are a test pocket 48 and a utility pocket 50 into which components 5 are selectively deposited according to whether or not electrical functioning thereof is to be tested. If electrical functioning of a component 5 is to be tested, then head assembly 24 deposits the component 5 into test pocket 48 for squaring of the component 5 and testing of electrical functioning thereof. A detailed disclosure of test pocket 48 may be found in the above cross-referenced U.S. application Ser. No. 693,987, now U.S. Pat. No. 4,721,907, except that the component receiving platform of the tester of the instant invention is not spring biased upwardly since the placement nozzle 24 will not remain on the component during subsequent testing thereof.

Figure 7:
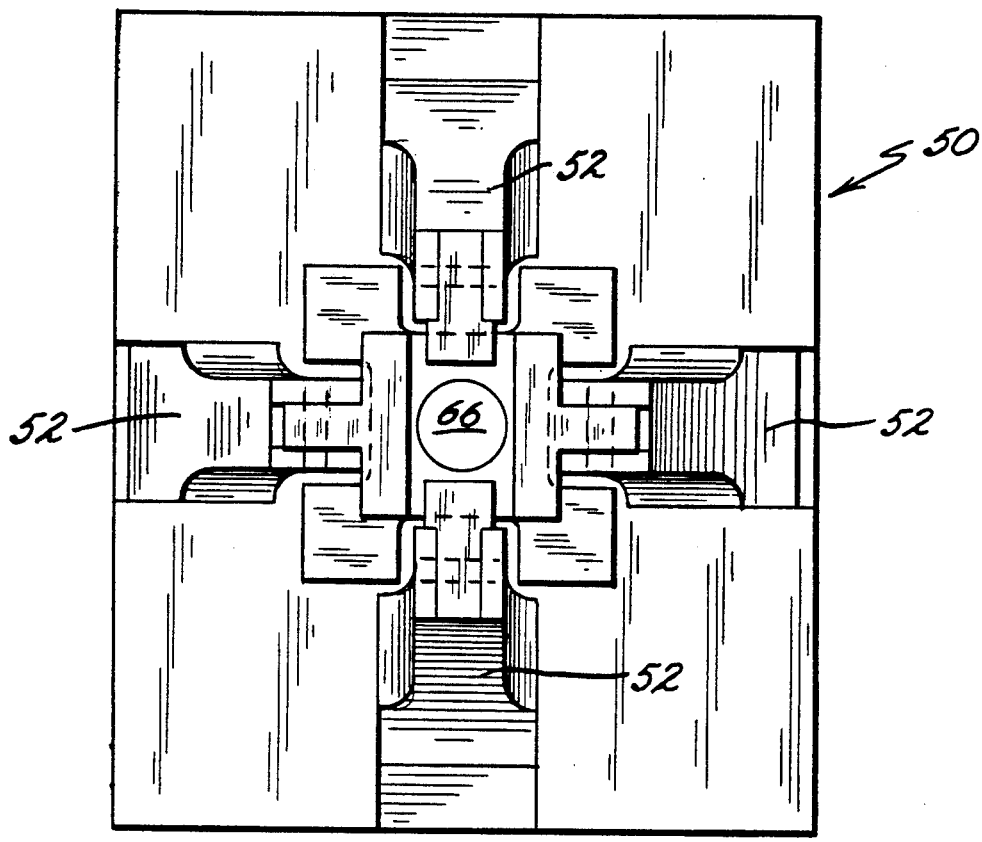
FIG. 7 is a top plan view of FIG. 6.

Referring to FIGS. 5–7, utility pocket 50 is provided in order to square and transport components which do not require testing just prior to placement thereof. Utility pocket 50 comprises a platform 66 upon which components are placed, and squaring arms 52 which are pivotal between an open and closed position about pivot points 56. A cam 60 is reciprocatable along camming surfaces 58 of the squaring arms 52 in order to open arms 52 against the biasing of springs 54. Cam 60 is attached to actuator rod 62 which, in turn, is attached to a piston rod via clevis 64, so that firing of cylinder 68 raises rod 62 and opens arms 52 through the camming action.

Figure 8:
FIG. 8 is a schematic view of a prior art linear vibratory feeder and a stop for the bulk components fed thereby.
Figure 9:
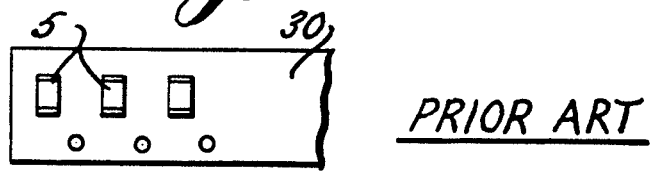
FIG. 9 is a fragmentary view of the prior art taped supply used in feeder reels at supply stations of the extended input assembly.
Figure 10:
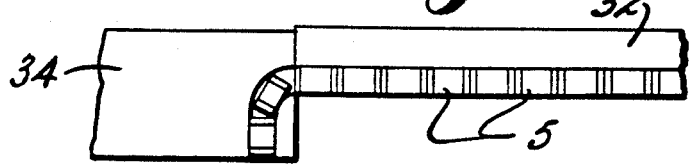
FIG. 10 is a view similar to FIG. 8, and illustrating a modified stop for grossly reorienting components fed by the vibrator linear feeder.

FIG. 9 illustrates a tape 30 of the reeled supply 28 wherein individual components 5 are encased in and spaced along tape 30. FIG. 8 illustrates the manner in which components 5 of the same general nature as those supplied in tapes 30 are fed to a stop 34 of a linear vibratory feeder 32 in an orientation which is 90° relative to the presentation of such components 5 by tape 30. Such a difference in orientation between the tape supply and a vibratory feeder supply naturally presents a problem for subsequent electrical function testing of the components at the test pocket 48. Accordingly, FIGS. 10 and 11 illustrate an improved stop 34 by which the components fed by vibratory feeder 32 are reoriented to correspond to the orientation of components supplied by tapes 30. In this way, all of the components to be tested are positioned properly for subsequent testing. As seen in FIGS. 11A and 11B, the improved stop 34 includes a reorientation groove 36 by which the vibratorily fed components 5 are reoriented. A cover 38 is provided over the reorientation portion of groove 36 and is further provided with a pointed portion 40 extending past the end of stop 34. Any components which reach stop 34 in an orientation in which they are "on edge", and thus unacceptable for subsequent handling, are diverted off of the feed rail of laboratory feeder 32 by pointed tip portion 40. Typical components that may be handled by the instant invention include SOT, SOIC, chip capacitors, chip resistors, diodes, and chip carriers with sizes ranging from 0.080 inches by 0.040 inches to 1.25 inches square.

As may be appreciated by referring to the drawings, transfer assembly 3 may be testing a particular component while transporting it between the shuttle unload station and the pick up position of the surface mounting machine and while shuttle 20 of the extended input 2 is retrieving another component from a selected supply station 26 and delivering the component to the shuttle unload station. Such an arrangement provides a time sharing capability that allows faster supply of components to the onsertion machine.

Having described the invention, it will be seen that the objects set forth above, among those made apparent from the preceding description, are efficiently obtained and, since certain changes may be made in carrying out the above method and in the construction set forth without departing from scope of the invention, it is intended that all matter contained in the above description or shown in the accompanying drawings, shall be interpreted as illustrative and not in a limiting sense. For instance, it is contemplated that a reorientation of components as illustrated in FIGS. 10 and 11 could be accomplished instead by rotation of the nozzle of vacuum head 24.

It is also to be understood that the following claims are intended to cover all of the generic and specific features of the instant invention herein described, and all statements of the scope of the invention which, as a matter of language, might be said to fall therebetween.

We claim:

1. A method of handling electrical components of a surface mounting type for subsequent placement at selected locations on a circuit board, and comprising the steps of:

providing an automated supply for a component placement machine, said automated supply comprising plural supply stations;

feeding components sequentially to each of said supply stations as needed for subsequent acquisition therefrom;

selecting at least one of said supply stations and acquiring a particular component therefrom;

delivering said particular component from said supply station to a transfer assembly which is situated at a shuttle unload station and returning to a selected supply station for another component;

testing electrical functioning of said particular component;

moving said transfer assembly between said shuttle unload station and a subsequent processing station in order to effect transferring of said particular component therebetween; and presenting said particular component to a placement head situated at said subsequent processing station.

2. A method as in claim 1, and further comprising the step of:

reorienting said particular component during said feeding at least one of said supply stations in order that said components are presented in a preferred orientation for said testing.

3. A method as in claim 1, and further comprising the step of:

reorienting said particular component during said delivering.

4. A method as in claim 1, and further comprising the step of:

performing said testing during said transferring.

5. A method as in claim 1, and further comprising the step of:

performing said testing at said transfer assembly while situated at said unload station.

6. An apparatus for handling electrical components of the surface mounting type for subsequent placement at selected locations on a circuit board, and comprising in combination:

an automated supply for a component placement machine, said automated supply comprising plural supply stations and means for feeding components sequentially to each of said supply stations as needed for subsequent acquisition therefrom;

shuttle means, operatively associated with said supply stations and selectively positionable at each of said supply stations, for acquiring a particular component from a selected supply station, delivering said particular component from said supply station to and unloading said particular component at a remote shuttle unload station, and returning to a selected supply station for another component, said shuttle means comprising at least one pick-up head for retrieving a component from said supply stations;

a transfer assembly;

testing means, operatively associated with said transfer assembly, for receiving said particular component from said shuttle means at said shuttle unload station and implementing testing of electrical functioning thereof; and means for moving said transfer assembly back and forth between said shuttle unload station and a placement head of a subsequent processing station in order to effect transferring of said particular component therebetween.

7. An apparatus as in claim 6, and further comprising:

means for reorienting said particular component during said feeding in order that said components are presented to said shuttle means in a preferred orientation for said testing.

8. An apparatus as in claim 6, and further comprising:

means, operatively associated with said transfer assembly moving means, for performing said testing during said transferring.

9. An apparatus as in claim 6, wherein said shuttle means comprises:

plural pick-up heads, at least one of which retrieves a component from at least one selected supply station during each cycle of said shuttle means.

10. An apparatus as in claim 9, wherein said pick-up heads each comprise:

a vacuum spindle which is reciprocatable in order to effect said acquiring.

11. An apparatus as in claim 9, and further comprising:

utility means, operatively associated with said transfer assembly and separate from said testing means, for receiving from said shuttle means components which are not to be tested and for presenting said components not to be tested to said subsequent processing station.

* * * * *